United States Patent [19]
Ohkuma et al.

[11] Patent Number: 5,776,634
[45] Date of Patent: Jul. 7, 1998

[54] PHOTOSENSITIVE RECORDING MEDIUM AND METHOD OF PREPARING VOLUME TYPE PHASE HOLOGRAM MEMBER USING SAME

[75] Inventors: Norio Ohkuma; Tetsuro Kuwayama; Toshiaki Majima, all of Yokohama; Naosato Taniguchi, Machida; Yomishi Toshida, Yokohama; Yoko Yoshinaga, Machida; Tetsuro Fukui, Kawasaki, all of Japan

[73] Assignee: Canon Kabushiki Kaisha, Tokyo, Japan

[21] Appl. No.: 247,456

[22] Filed: May 23, 1994

Related U.S. Application Data

[63] Continuation of Ser. No. 795,400, Nov. 21, 1991, abandoned.

[30] Foreign Application Priority Data

Nov. 22, 1990 [JP] Japan ................................ 2-316178

[51] Int. Cl.$^6$ .................................................. G03H 1/04
[52] U.S. Cl. .......................... 430/2; 430/1; 430/280.1; 430/281.1; 359/3; 522/4
[58] Field of Search .................... 430/1, 2, 280, 430/281, 289, 281.1, 289.1; 522/4, 6, 7, 26, 50, 31, 15, 14, 18, 24, 25, 28; 359/1, 3

[56] References Cited

U.S. PATENT DOCUMENTS

| | | | |
|---|---|---|---|
| 3,380,831 | 4/1968 | Cohen et al. | 96/115 |
| 3,715,293 | 2/1973 | Sandner et al. | 522/44 |
| 3,923,507 | 12/1975 | Ohlschlager et al. | 430/78 |
| 4,054,455 | 10/1977 | Schlesinger et al. | 430/2 |
| 4,058,400 | 11/1977 | Crivello | 430/286 |

(List continued on next page.)

FOREIGN PATENT DOCUMENTS

| | | | |
|---|---|---|---|
| 324482 | 7/1989 | European Pat. Off. | 430/1 |
| 344911 | 12/1989 | European Pat. Off. | 430/281 |
| 0360869 | 4/1990 | European Pat. Off. | C08G 59/68 |
| 0425440 | 5/1991 | European Pat. Off. | G03F 7/031 |
| 2-280423 | 11/1990 | Japan | H04B 7/15 |

OTHER PUBLICATIONS

JP 01-11108 Abstract only (Aikawa) Jan. 1989.
S.P. Pappas et al., "Photosensitization of Diphenyliodonium and Triphenylsulfonium Salts", J. Polym. Sci., vol. 22, pp. 77–84 (1984), Polym. Chem. Edition.
Tetrahedron, vol. 38, No. 9, pp. 1203–1211 (1982), Specht et al., "Ketocoumarins".
Crivello, et al "Aromatic Bisvinyl Ethers", Jour. Polym. Sci. vol. 21, No. 6, pp. 1785–1799 (1983).

*Primary Examiner*—Martin Angebranndt
*Attorney, Agent, or Firm*—Fitzpatrick, Cella, Harper & Scinto

[57] ABSTRACT

A photosensitive recording medium comprises a composition containing a radical-polymerizable monomer, a cationic-polymerizable monomer, a radical polymerization initiator, and a cationic-polymerization initiator as main constituents. A method of producing a hologram comprises a first step of preparing the photosensitive recording medium; a second step of exposing the medium to an interference pattern of radiation rays; and a third step of exposing the entire region of the medium to light; and optionally a fourth step of heating the entire of the medium.

10 Claims, 1 Drawing Sheet

U.S. PATENT DOCUMENTS

| | | | |
|---|---|---|---|
| 4,058,401 | 11/1977 | Crivello | 430/280 |
| 4,156,035 | 5/1979 | Tsao et al. | 427/44 |
| 4,173,474 | 11/1979 | Tanako et al. | 430/1 |
| 4,210,449 | 7/1980 | Schlesinger et al. | 430/1 |
| 4,250,053 | 2/1981 | Smith | 252/246 |
| 4,291,114 | 9/1981 | Berggren | 430/253 |
| 4,426,431 | 1/1984 | Harasta et al. | 430/280 |
| 4,428,807 | 1/1984 | Lee et al. | 204/159.14 |
| 4,588,664 | 5/1986 | Fielding et al. | 430/2 |
| 4,623,676 | 11/1986 | Kistner et al. | 430/280 |
| 4,717,605 | 1/1988 | Urban et al. | 428/1 |
| 4,751,102 | 6/1988 | Adair et al. | 522/25 |
| 4,849,320 | 7/1989 | Irving et al. | 522/4 |
| 4,913,990 | 4/1990 | Rallison | 430/30 |
| 4,937,159 | 6/1990 | Gottschalk et al. | 522/25 |
| 4,942,102 | 7/1990 | Keys et al. | 430/2 |
| 4,942,112 | 7/1990 | Monroe et al. | 430/282 |
| 4,959,283 | 9/1990 | Smothers et al. | 430/1 |
| 4,970,129 | 11/1990 | Ingwall et al. | 430/1 |
| 4,985,340 | 1/1991 | Palazzotto et al. | 430/281 |
| 5,002,855 | 3/1991 | Fan et al. | 430/270.1 |
| 5,026,618 | 6/1991 | Kushibiki et al. | 430/2 |
| 5,098,804 | 3/1992 | Booth | 430/1 |
| 5,102,924 | 4/1992 | Williams et al. | 522/4 |
| 5,178,988 | 1/1993 | Leech et al. | 430/288 |
| 5,213,915 | 5/1993 | Ichihashi et al. | 430/2 |
| 5,262,277 | 11/1993 | Sato et al. | 430/283.1 |

PHOTOSENSITIVE RECORDING MEDIUM AND METHOD OF PREPARING VOLUME TYPE PHASE HOLOGRAM MEMBER USING SAME

This application is a continuation of application Ser. No. 07/795,400 filed Nov. 21, 1991, now abandoned.

BACKGROUND OF THE INVENTION

1. Field of the Invention

The present invention relates to a photosensitive recording medium and a method of preparing a volume type phase hologram using the same.

2. Related Background Art

When a coherent light wave like a laser beam is projected onto an object, the amplitude and the phase of the light wave are modulated in accordance with the shape of the object. The modulated light reflected thereon or transmitted is received on a photo-sensitive recording medium and recorded, and a hologram thus formed is irradiated by light to reproduce an optical image.

With the development of the study on holography technique, requirements on the properties of recording mediums for holography have become more clear. Many materials are proposed for the hologram material, such as bleached silver halide, photoresists, thermoplastics, dichromated gelatin, inorganic glass materials, ferromagnetic materials, and the like, and the characteristics of the materials are being investigated comprehensively.

For example, bleached silver halide, and dichromated gelatin sensitized by Methylene Blue or the like are well known as a photosensitive hologram recording medium sensitive in a visible region.

U.S. Pat. No. 4,942,112 discloses a photopolymerizable composition composed of a polymer binder and an ethylenic unsaturated monomer having a carbazole ring or an aromatic ring for the photosensitive recording medium.

The properties required to the photosensitive recording medium for hologram are as follows:

(1) High recording sensitivity, in particular, high sensitivity to laser beam in visible region,
(2) High resolution,
(3) High diffraction efficiency of hologram,
(4) Low noise in hologram,
(5) Stability of hologram, and
(6) Easiness of the operations of recording and reproduction.

These properties cannot readily be achieved. Only few of known recording mediums have some of the above properties at practically usable levels.

A bleached silver halide type recording medium and a dichromated gelatin type of recording medium are practically usable although not being completely satisfactory. However, the former type of medium has the disadvantages that they require bleaching treatment in addition to the usual treatments and the resulting hologram has low light-durability, and the latter type of medium has a serious defect of low water durability.

The recording mediums described in the aforementioned U.S. Pat. No. 4,942,112 are required to be improved to give larger refractive index modulation and to give a hologram of thinner film thickness.

SUMMARY OF THE INVENTION

The present invention intends to provide an improved photosensitive recording medium having above-described required properties, and a method of preparing a hologram using the recording medium, which could not be attained by a known hologram recording medium.

The present invention provides a photosensitive recording medium, comprising a composition containing a radical-polymerizable monomer, a cationic-polymerizable monomer, a radical-polymerization initiator, and a cationic-polymerization initiator as main constituents.

The present invention also provides a method of producing a hologram comprising a first step of preparing a photosensitive recording medium containing a radical-polymerizable monomer, a cationic-polymerizable monomer, a radical-polymerization initiator, and a cationic-polymerization initiator as main constituents; and a second step of exposing the medium to an interference pattern of radiation rays; and a subsequent third step of exposing the entire region of the medium to light.

The present invention further provides a method of producing a hologram comprising a first step of preparing a photosensitive recording medium containing a radical-polymerizable monomer, a cationic-polymerizable monomer, a radical-polymerization initiator, and a cationic-polymerization initiator as main constituents; a second step of exposing the medium to an interference pattern of radiation rays; a third step of exposing the entire region of the medium to light; and a fourth step of heating the entire of the medium.

DESCRIPTION OF THE PREFERRED EMBODIMENTS

Figure 1:
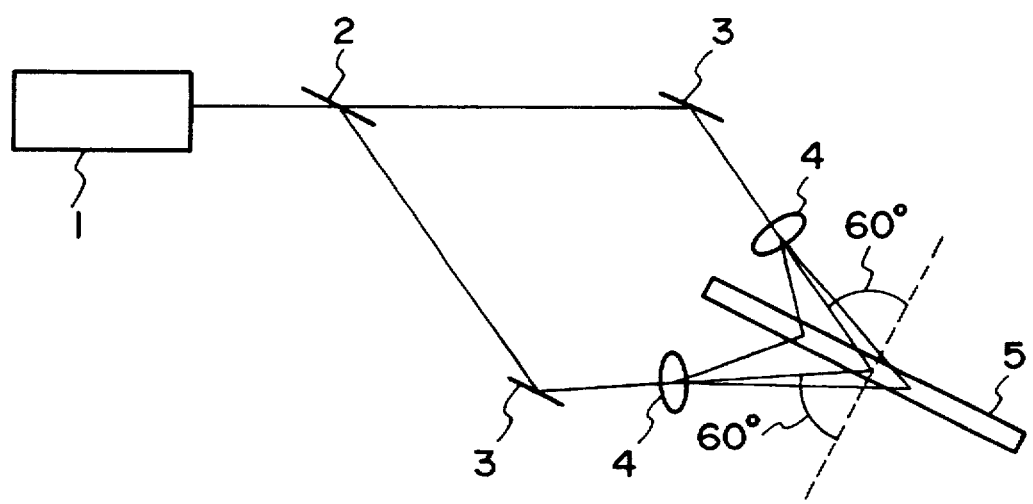
FIG. 1 illustrates an example of construction optics employed in a process of preparing a hologram.

The photosensitive recording medium of the present invention contains a radical-polymerizable monomer, a cationic-polymerizable monomer, a radical-polymerization initiator, and a cationic-polymerization initiator as main constituents. Firstly, either the radical-polymerizable monomer or the cationic-polymerizable monomer is selectively polymerized imagewise to form a hologram. Namely, either a radical polymerization or a cationic polymerization starts selectively and proceeds in bright region (antinodes) by interference fringe. As selective monomer is considered to diffuse from dark region (nodes) to bright region, therefore, density or refractive index gradient is formed. Subsequently the entire face is exposed to light to polymerize the radical-polymerizable monomer and the cationic-polymerizable monomer in the non-imaged (nodes) portion to obtain high modulation of refractive index.

For example, the recording medium of the present invention is firstly irradiated with coherent light in accordance with a hologram information to cause a reaction of only a radical polymerization initiator and to polymerize only a radical-polymerizable monomer, whereby a hologram is formed on the recording medium. In this case, the wavelength range of the irradiation light is selected such that the cationic-polymerization initiator does not respond to the irradiated light.

Subsequently, the entire face of the medium is irradiated with another light to which both of the radical-polymerization initiator and the cationic-polymerization initiator will respond.

Consequently, the antinodes portion contains the polymer of the radical-polymerizable monomer, while the nodes portion contains both the polymer of the radical-polymerizable monomer and. the polymer of the cationic-polymerizable monomer, thereby causing a large difference between the refractive index of the antinodes portion and that of the nodes portion.

The above is only one example of the present invention. The cationic-polymerizable monomer may firstly be polymerized selectively.

A preferred embodiment is further described to explain the present invention in more detail.

The radical polymerizable monomer to be employed in the present invention may be either monofunctional or multifunctional, provided that it has an ethylenic unsaturated double bond in the molecule, and may be either in a liquid state or in a solid state.

Specifically, the radical-polymerizable monomer includes 1,5-pentanediol diacrylate, ethylene glycol diacrylate, 1,4-butanediol diacrylate, diethylene glycol diacrylate, hexamethyelene glycol diacrylate, 1,3-propanediol diacrylate, decamethylene glycol diacrylate, decamethylene glycol dimethacrylate, 1,4-hyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylate trimethylolpropane triacrylate or trimethacrylate and analogous compounds to those mentioned in U.S. Pat. No. 3,380,831, pentaerythritol tetracrylate, triethylene glycol diacrylate, triethylene glycol dimethacrylate, polyoxypropyltrimethylolpropane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, pentaerythritol tetramethacrylate, trimethylolpropane trimethacrylate, 1,5-pentanediol dimethacrylate, diallyl fumarate, and the like.

Further, diacrylate and dimethacrylate of bisphenol A, and bisphenol A-epoxy adducts are also useful, specifically including di(3-methacryloxy-2-hydroxypropyl) ether of bisphenol A, di-(2-methacryloxyethyl) ether of bisphenol A, di(3-acryloxy-2-hydroxypropyl) ether of bisphenol A, di(2-acryloxyethyl) ether of bisphenol A, ethoxylate bisphenol A diacrylate, di(3-methacryloxy-2-hydroxypropyl) ether of tetrachlorobisphenol A, di(2-methacryloxyethyl) ether of tetrachlorobisphenol A, di(3-methacryloxy-2-hydroxypropyl) ether of tetrabromobisphenol A, di(2-methacryloxyethyl) ether of tetrabromobisphenol A, and the like.

Further examples of the useful radical-polymerizable monomers are compounds having an isocyanate group, such as adducts of a compound such as 1,4-cyclohexyl diisocyanate, 1,3,5-cyclohexyl triisocyanate and 1,4-benzene diisocyanate with a compound such as 2-hydroxyethyl acrylate (or methacrylate), and 2-hydroxypropyl acrylate.

Still further examples of the useful radical-polymerizable monomers are styrene, 2-chlorostyrene, phenyl acrylate, 2-phenylethyl acrylate, 2,2'-di(p-hydroxyphenyl) propane diacrylate and methacrylate, 1,4-benzene diacrylate and methacrylate, 1,4-diisopropenylbenzene, 1,3,5-triisopropenylbenzene, and the like.

Still further examples of the preferable radical-polymerizable monomer are shown below: isobornyl methacrylate, isobornyl acrylate, adamantyl acrylate and methacrylate, CR-39; acrylate, methacrylate, diacrylate and dimethacrylate having a dicyclopentadiene represented by the structural formula (X) below on the side chain:

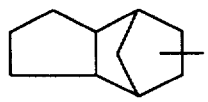

(X)

phentyl methacrylate, Ω-menthyl methacrylate, dimethyladamantyl methacrylate; the compounds represented by the general formula (I) below:

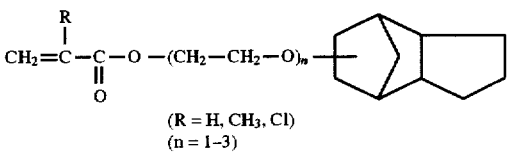

(R = H, CH₃, Cl)
(n = 1–3)

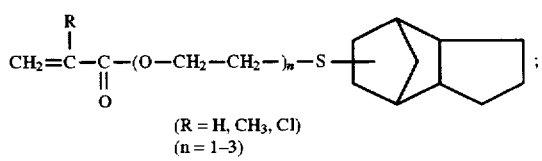

(R = H, CH₃, Cl)
(n = 1–3)

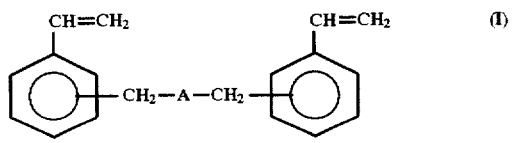

(I)

where A represents

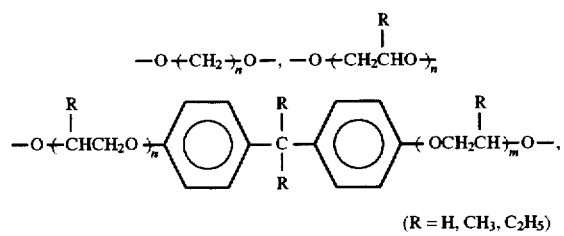

(R = H, CH₃, C₂H₅)

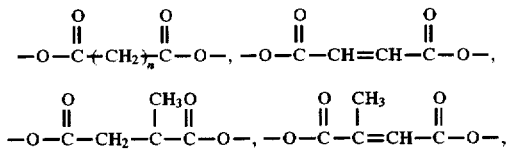

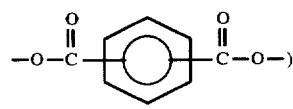

or

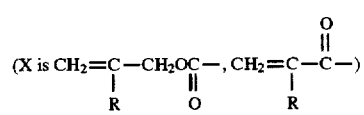

$(X \text{ is } CH_2=\underset{R}{C}-CH_2OC-, CH_2=\underset{R}{C}-\underset{O}{\overset{O}{C}}-)$ (R = H, CH₃, Cl))

The present invention, however, is not limited to the above monomers.

The radical-polymerizable monomer is incorporated in the photosensitive composition in an amount of from 10 to 60% by weight.

Next, the cationic-polymerizable monomer employed in the present invention is described below. The cationic-polymerizable monomer generally has, in the molecule, a cyclic ether or thioether group such as epoxy ring. In particular, in view of the sensitivity, typical alicyclic compounds are listed below without limiting the invention.
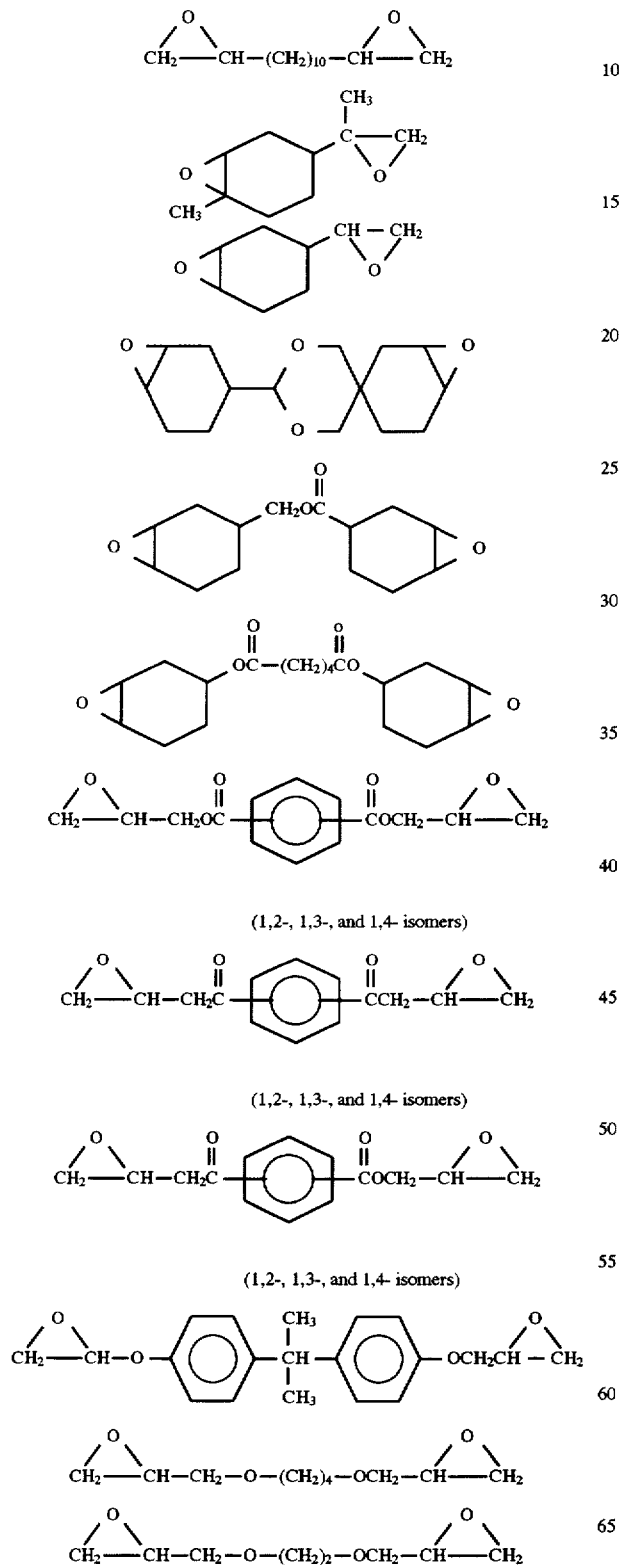
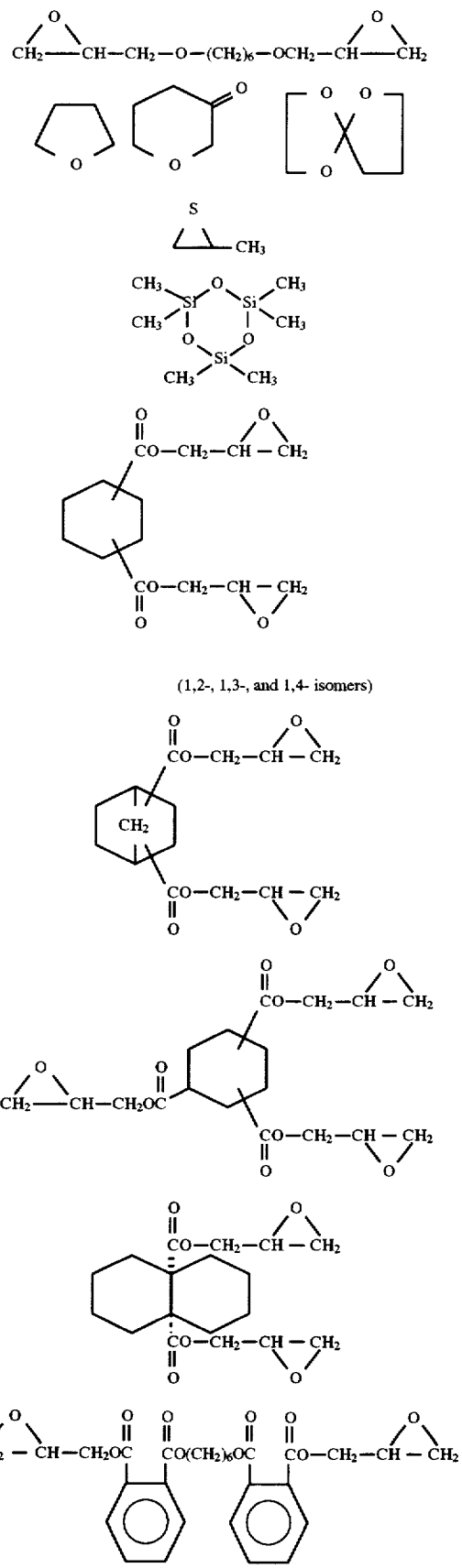

-continued

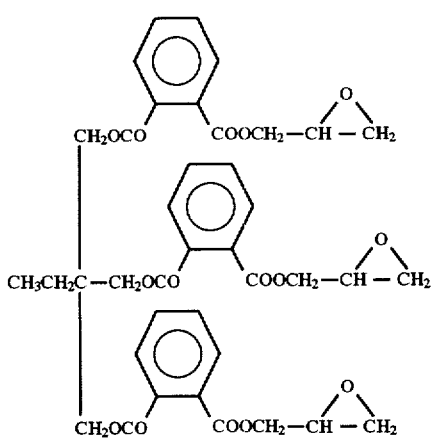

The vinyl ethers shown below are also useful (see J. V. Crivello, et al.: Journal of Polymer Science, Polymer Chemistry Ed. 21, 1785 (1983)).

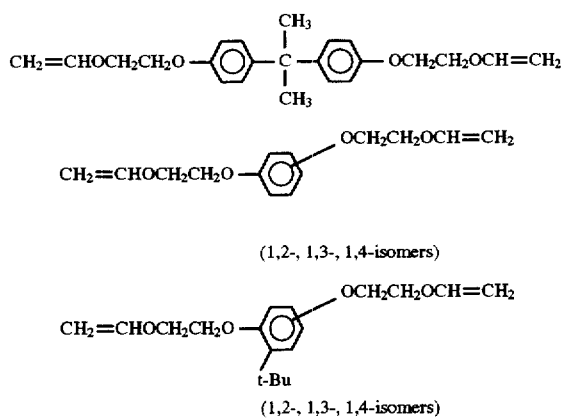

Further, spiro-orthoesters, spiro-orthocarbonate, and bicyclo-orthoesters are also useful. The examples are shown below. These compounds preferably cause large modulation of the refractive index since they have small volume-constriction on polymerization.

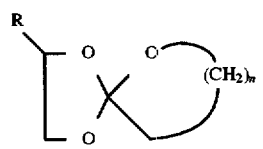

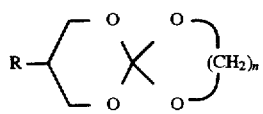

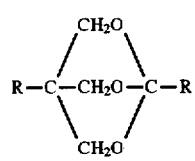

(where R is an alkyl group, or an alkoxy group, and n is an integer.)

The cationic-polymerizable monomer is incorporated in the photosensitive composition in an amount of from 10 to 60% by weight.

As the polymerizable monomer in the present invention, there may be used an amphoteric compound having both an ethylenic unsaturated double bond and a cationic-polymerizable structure. The examples are vinyl monomers having a (cationic-polymerizable) carbazole ring such as N-vinylcarbazole, 3-chlorovinylcarbazole, 3,6-dibromo-9-vinylcarbazole, and the like. Further, the compounds of the structure having an ethylenic unsaturated double bond as shown below may also be used.

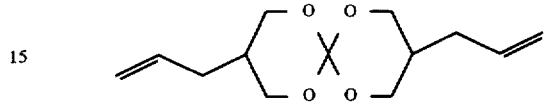

The aforementioned amphoteric monomers have separate reaction sites for radical polymerization and cationic polymerization, thereby causing refractive index modulation. Therefore, by use of such amphoteric monomer in the present invention, a hologram can be recorded with one amphoteric monomer, a radical-polymerization initiator, and a cationic-polymerization initiator.

The photo-polymerization initiator employed in the present invention, which consists of radical polymerization initiator and cationic-polymerization initiator, is explained below.

As the radical-polymerization initiator, useful compounds are conventionally employed aromatic ketones, aromatic diketones, and the like. Typical examples are benzophenone derivatives, benzoin derivatives, benzil derivatives, xanthone derivatives, thioxanthone derivatives, ketocoumarin derivatives, and so forth.

Specific examples include benzophenone, Michler's ketone, benzil, 4,4'-dimethoxybenzil, camphorquinone, benzophenone derivatives having a peroxy-acid-ester structure, xanthone, thioxanthone, 2-chlorothioxanthone, 3-ketocoumarine derivatives (see: Donald P. S. Pecht, et al.: Tetrahedron, Vol. 38, No. 9, 1203–1211 (1982)), and so forth. Further, commercially available Irgacure-184, -651, and -907 supplied by Ciba Geigy Co. are useful. The formulas thereof are shown below.

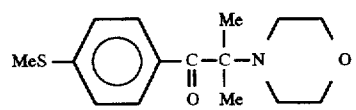
Irgacure-907

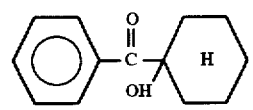
Irgacure-184

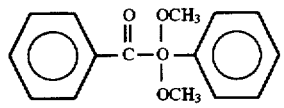
Irgacure-651

Most of these compounds exhibit effective light absorption at a short wavelength region (a UV region) of 400 nm or shorter. However, a radical-polymerization initiator which is effective in a visible region is desirable for hologram recording.

Preferable examples of such an initiator include 3,3'-carbonylbiscoumarin having a dialkylamino group at 7-position from among the aforementioned 3-ketocoumarin derivatives, since it is capable of being sensitized at the wavelength of up to about 500 nm.

The cationic dye-borate anion complexes described in Japanese Patent Application Laid-Open Nos. 62-143044 and 62-150242 are made sensitive in the wavelength region of up to about 700–800 nm by suitably selecting the dye, and are especially useful as the radical-polymerization initiator of the present invention.

In recent years, polymerization initiators, which are a combination of a radical-polymerization initiator with a sensitizer capable of absorbing light effectively in visible region, were comprehensively investigated. Such initiators as of the type are also useful in the present invention. The sensitizer used therefor includes merocyanine-dyes, coumarin dyes, anthraquinone dyes, styryl phenyl ketone derivatives having a dialkylamino group, styryl styryl ketone derivatives, and the like. The radical-polymerization initiator includes camphorquinone, diphenyl iodonium salt, biimidazole derivatives, and the like.

In the case where the radical-polymerization initiator employed is diphenyl iodonium salt, the counter ion such as $B^{\ominus}F_4$, $P^{\ominus}F_6$, and $As^{\ominus}F_6$ generates a strong acid which initiates cationic polymerization, and therefore the generation of a strong acid needs to be suppressed by using a counter anion such as $B^{\ominus}(phenyl)_4$. The sensitivity of the radical-polymerization initiator can be improved by adding an amine or a mercaptan as the hydrogen donor.

The radical-polymerization initiator is used singly, and is added to the sensitization composition in an amount of from 0.5 to 5 wt %.

Further the initiator is used in combination with a sensitizer. In this case, the initiator and the sensitizer are added thereto in an amount of from 0.5 to 5 wt % collectively.

The cationic-polymerization initiator used in the present invention is explained below.

The useful cationic-polymerization initiator includes salts having a non-nucleophilic anion such as $B^{\ominus}F_4$, $P^{\ominus}F_6$, $As^{\ominus}F_6$, $Sb^{\ominus}F_6$, and so forth. The examples thereof are shown below.

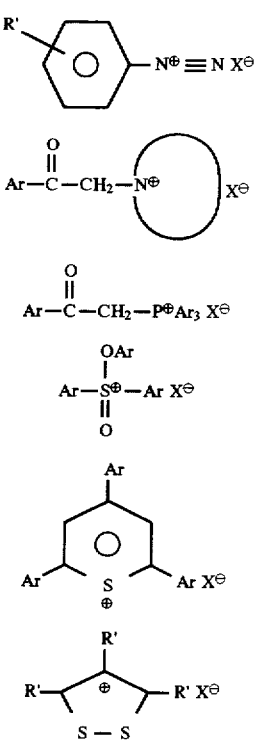

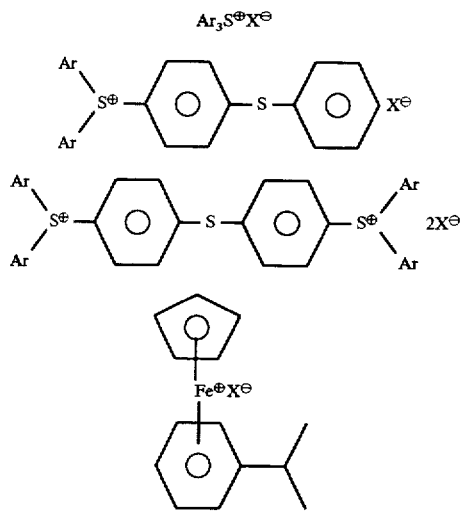

where Ar is an aryl group; $X^-$ is an anion of $B^-F_4$, $P^-F_6$, $As^-F_6$, or $Sb^-F_6$; R' is an alkyl group or an alkoxy group.

The compounds of Ar—I$^+$—Ar X$^-$, although they seem to be useful, cannot be used because they have high ability of initiating radical polymerization as mentioned above.

The above cationic-polymerization initiators are made sensitive in the visible light region by combining them a sensitizing dye such as Acridine Orange, Acridine Yellow, Phosphine R, benzoflavin, merocyanine, and so forth.

Such a cationic-polymerization initiator is used singly or in combination with a sensitizing dye, and is incorporated in the photosensitive composition in an amount of from 0.5 to 5 wt %.

The essential constituents of the recording medium of the present invention are described above. The recording medium of the present invention may suitably further contain a binder, a plasticizer, a stabilizer, or the like according to the purpose such as increase of contrast, improvement in heat stability, and improvement in film formation property.

Any organic linear polymer which is compatible with the aforementioned essential components may be used as the binder.

The examples of the binder include cellulose acetate lactate, polymethyl methacrylate, acryl type polymers and interpolymers including methyl methacrylate/methacrylic acid copolymers and methyl methacrylate/acrylic acid copolymers, terpolymers of methyl methacrylate/($C_2$–$C_4$ alkyl acrylate or methacrylate)/(acrylic or methacrylic acid), polyvinyl acetate, polyvinylacetal, polyvinylbutyral, polyvinylformal, and the like.

The examples of the plasticizer are triethylene glycol, triethylene glycol diacetate, triethylene glycol dipropionate, triethylene glycol dicaprate, triethylene glycol dimethyl ether, triethylene glycol bis(2-ethylhexanoate), tetraethylene glycol diheptanoate, poly(ethylene glycol), poly(ethylene glycol) methyl ether, isopropylnaphthalene, diisopropylnaphthalene, poly(propylene glycol) glyceryltributyrate, diethyl adipate, diethyl cebacate, tributyl phosphate, tris(2-ethylhexyl) phosphate, BREE®30 [$C_{12}H_{25}(OCH_2CH_2)_4OH$], BREE®35 [$C_{12}H_{25}(OCH_2CH_2)_{20}OH$], and the like.

The examples of the useful stabilizer are hydroquinone, Phenidone, p-methoxyphenol, alkyl- or allyl-substituted hydroquinones and quinones, t-butylcatechol, pyrogallol, copper resinate, naphtylamine, β-naphthol, cuprous chloride, 2,6-di-t-butyl-p-cresol, phenothiazine, pyridine, nitrobenzene, dinitrobenzene, p-toluquinone, chloranil, and the like.

The steps of preparing the hologram by use of the recording medium of the present invention is described below.

The essential constituents of the present invention and optional additives are dissolved or dispersed in a solvent. Then the solution or the dispersion is applied on a glass plate or a transparent film as a support. After drying, a transparent film such as a polyethylene terephthalate film is laminated thereon as a retaining layer (which serves also to intercept oxygen).

Subsequently, laser beam is irradiated onto the above recording medium. The laser beam which causes the reaction of the initiator for polymerizing selectively the intended monomer contained in the medium. Thereby a hologram is formed.

Here, an embodiment is explained below in which a hologram recording medium contains a radical-polymerization initiator causing reaction by visible light and a cationic-polymerization initiator causing reaction by ultraviolet light.

FIG. 1 illustrates an example of a construction optics employed in a process of preparing hologram. In FIG. 1, the numeral 1 denotes a light source (laser); 2 a half mirror; 3 a mirror; 4 a beam expander (×20); and 5 a recording medium.

A hologram is recorded by an interference pattern produced by two coherent beams, comprising an object beam and a reference beam which have a wavelength within the photosensitive range of the radical-polymerization initiator. Consequently, only the radical-polymerizable monomer in the bright portion polymerizes selectively, forming a volume type phase hologram.

Thereafter, the entire face of the recording medium is exposed to light (in the region from ultraviolet light to visible light) such as light from Xe-ray lamp, to which both of the radical-polymerization initiator and the cationic-polymerization initiator respond, to polymerize the radical-polymerizable monomer and the cationic-polymerizable monomer in the nodes respectively.

By the above-mentioned process, the antinodes portion of the medium is constituted only of a polymer derived from the radical-polymerizable monomer, while the other portion of the medium is constituted of a mixture of a polymer of the radical-polymerizable monomer and a polymer of the cationic-polymerizable monomer. Thereby, modulation of refractive index is brought about between the two portions.

The resulting hologram has a sufficient modulation of refractive index. In some cases, the extent of the modulation of refractive index is further increased by a suitable swelling treatment or heating treatment. The heating treatment is conducted preferably at a temperature in the range of from 50° to 150° C., more preferably from 80° to 120° C., for a time of from 30 to 120 minutes.

Before exposure to light of interference pattern, the radical-polymerizable monomer and the cationic-polymerizable monomer may be preliminarily polymerized to some extent by exposure to an Xe-ray lamp.

The present invention is described in more detail by reference to examples.

EXAMPLE 1

The components below were dissolved in a mixture of chlorobenzene and dichloromethane in a volume ratio of 4:1. The solution was applied on a glass substrate plate, and dried to form a 10 µpm thick film.

-Radical-polymerizable monomer:

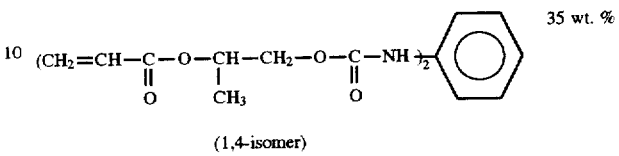

(1,4-isomer)

-Cationic-polymerizable monomer:

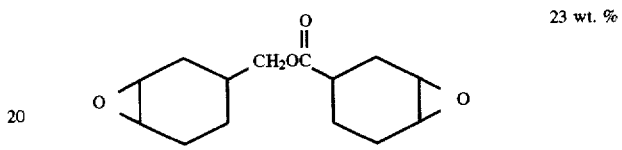

Radical-polymerization initiator:

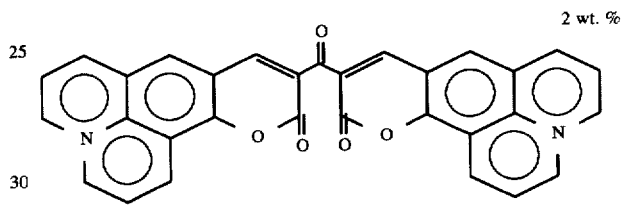

Camphorquinone 2 wt. %

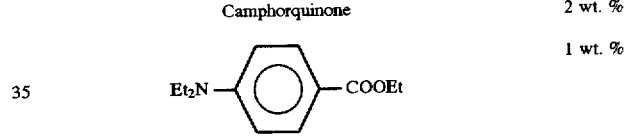

1 wt. %

-Cationic-polymerization initiator:

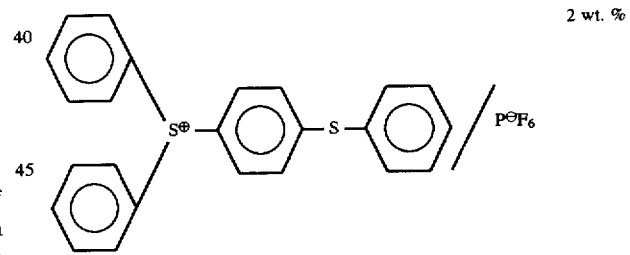

2 wt. %

Binder:

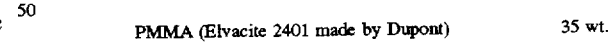

PMMA (Elvacite 2401 made by Dupont)   35 wt. %

Onto this film, a polyethylene terephthalate film is laminated in a thickness of 3.5 µm to prepare a recording medium.

The above recording medium was firstly exposed to laser beam from an Ar laser (488 nm) by means of an apparatus as shown in FIG. 1 (about 200 mJ/cm$^2$). Subsequently, the entire face of the recording medium was exposed to light from a 500-W Xe-lamp at a distance of 20 cm from the recording medium face for about 10 seconds.

The resulting hologram was a volume type phase hologram having diffraction efficiency of 80% and transmittance of 72%.

EXAMPLE 2

A recording medium was prepared in the same manner as in Example 1 except that the components below were used.

Radical-polymerizable monomer:

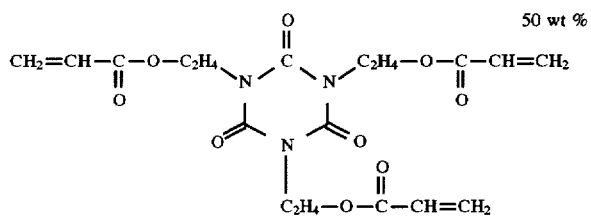
50 wt %

Cationic-polymerizable monomer:

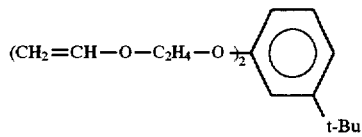
45 t %

(1,4-isomer)

Radical-polymerization initiator:

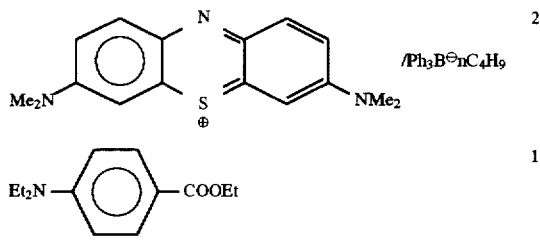
2 wt %

1 wt %

Cationic-polymerization initiator:

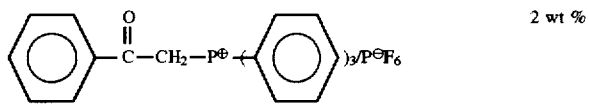
2 wt %

With this recording medium, a hologram was obtained in the same manner as in Example 1 except that He-Ne laser was used as the light source in the apparatus as shown in FIG. 1.

The resulting hologram was a volume type phase hologram having diffraction efficiency of 82% and transmittance of 80%.

EXAMPLE 3

A recording medium was prepared in the same manner as in Example 1 except that the components below were used.

Radical-polymerizable monomer:

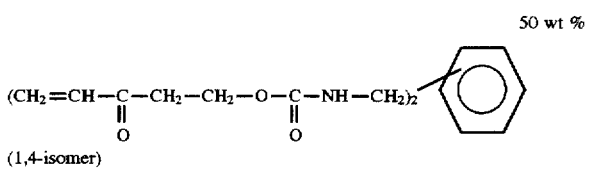
50 wt %

(1,4-isomer)

Cationic-polymerizable monomer:

20 wt %

Radical-polymerization initiator:

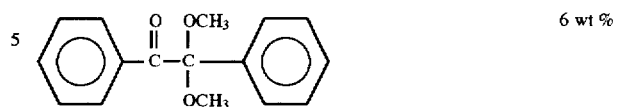
6 wt %

Cationic-polymerization initiator:

Acridine Orange  2 wt %

2 wt %

Binder:

PMMA (Elvacite 2401 made by DuPont)  21 wt %

With this recording medium, a hologram was prepared in the same manner as in Example 1.

Incidentally, the light source as shown in FIG. 1 employed in this Example was an argon laser (488 nm).

The resulting hologram was a volume type phase hologram having diffraction efficiency of 75% and transmittance of 83%.

In this Example, the cationic-polymerizable monomer was selectively polymerized by an interference pattern.

EXAMPLE 4

A recording medium was prepared in the same manner as in Example 1 except that the components below were used.

Radical-polymerizable monomer:

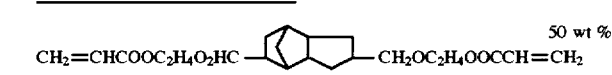
50 wt %

Cationic-polymerizable monomer:

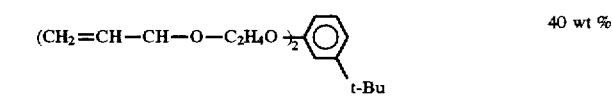
40 wt %

(1,4-isomer)

Radical-polymerization initiator:

1,3,3,1',3',3'-hexamethyl-2,2'-indodicarbocyanine tri-p-methoxyphenylbutylborate  2 wt %

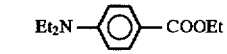
1 wt %

Cationic-polymerization initiator:

2 wt %

With this recording medium, a hologram was obtained in the same manner as in Example 1.

The resulting hologram was a volume type phase hologram having diffraction efficiency of 50% and transmittance of 85%.

The above hologram was heated at 120° C. for 30 minutes, thereby obtained a volume type phase hologram which had diffraction efficiency of 83% and transmittance of 80%.

EXAMPLE 5

The hologram obtained in Example 1 was heated at 120° C. for 2 hours. Consequently, the diffraction efficiency was improved from 80% to 93%.

EXAMPLES 6–8

Three kinds of recording mediums different in thickness were prepared in the same manner as in Example 1 except that the components below were used: the thicknesses being 7 μm in Example 6, 15 μm in Example 7, and 23 μm in Example 8.

Radical-polymerizable monomer:

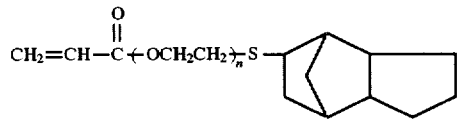   50 wt %

Cationic-polymerizable monomer:

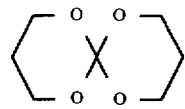   42 wt %

Radical-polymerization initiator:

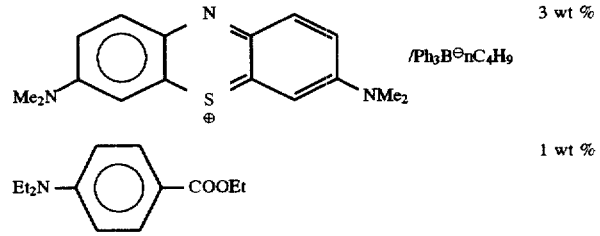   3 wt %

   1 wt %

Cationic-polymerization initiator:

(⟨◯⟩)₃S⁺ CF₃COO⁻   4 wt %

By using the above recording mediums, holograms were prepared in the same manner as in Example 2.

The resulting holograms had the diffraction efficiencies below:

Example 6 (thickness: 7 μm) : 35%

Example 7 (thickness: 15 μm) : 63%

Example 8 (thickness: 23 μm) : 80%

EXAMPLES 9–11

Three kinds of recording mediums were prepared in the same manner as in Example 7 except that the cationic-polymerizable monomer was replaced by the following three compounds respectively.

EXAMPLE 9 (CATIONIC-POLYMERIZABLE MONOMER)

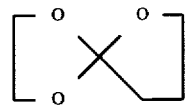

EXAMPLE 10 (CATIONIC-POLYMERIZABLE MONOMER)

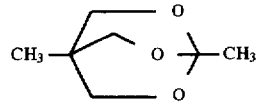

EXAMPLE 11 (CATIONIC-POLYMERIZABLE MONOMER)

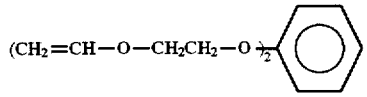

Holograms were prepared by using the above recording mediums in the same manner as in Example 2. The prepared holograms were heated at 100° C. for one hour. The resulting holograms had the diffraction efficiencies as below:

Example 9: 87% (Diffraction efficiency)

Example 10: 67% (Diffraction efficiency)

Example 11: 30% (Diffraction efficiency)

As described above, the present invention provides a photosensitive recording medium and a hologram having excellent properties below:

(1) The hologram has high resolution and high diffraction efficiency stably.

(2) Large refractive index modulation is obtained by operations of interference pattern exposure and entire face exposure only.

(3) Hologram recording is feasible in a visible region by selecting the radical-polymerization initiator and the cationic-polymerization initiator.

(4) The recording medium has a good durability.

(5) The recorded hologram is stable in storage (resistant to environment) since the monomer has been changed to a polymer in the whole region.

What is claimed is:

1. A volume phase hologram produced by the process comprising: irradiating a recording layer of a volume phase hologram recording medium with coherent radiation employing an object beam and a reference beam from opposite sides, said volume phase hologram recording medium comprising a substrate a substrate of a glass plate or a transparent film and a recording layer on said substrate, said recording layer comprising a composition containing (a) a radical-polymerizable monomer, (b) a cationic-polymerizable monomer, and (c) an initiator combination of a radical-polymerization initiator having a sensitivity in a visible light region and a cationic-polymerization initiator having a sensitivity in an ultraviolet light region as main constituents, wherein the radical-polymerization initiator and the cationic-polymerization initiator are sensitive in light wavelength regions different from each other; said radical polymerization initiator being sensitive to coherent radiation in the visible light region of a wavelength of at least about 450 nm to initiate polymerization of said radical-polymerizable monomer to form an interference pattern and said cationic-polymerization initiator being insensitive to said coherent radiation;

wherein said initiator combination of said radical-polymerization initiator and said cationic-polymerization initiator is selected from the group consisting of: A, B, C, D and E, wherein (A) is (i) a radical-polymerization initiator of the formula

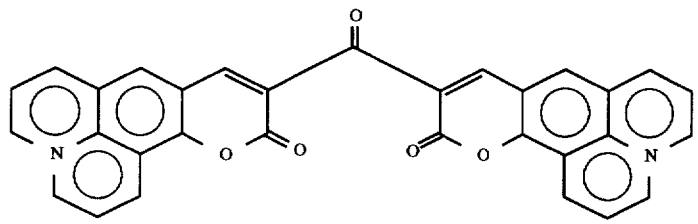

camphorquinone, and

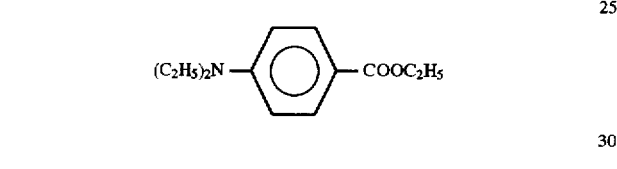

and (ii) a cationic polymerization initiator of formula:

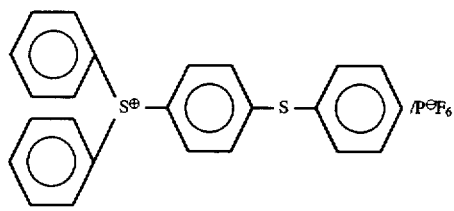

wherein (B) is (i) a radical polymerization initiator of the formula:

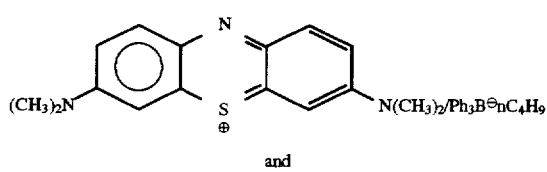

and

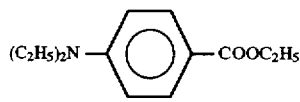

and (ii) a cationic polymerization initiator of the formula:

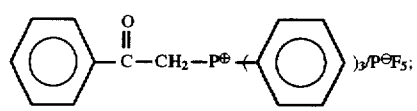

wherein (C) is (i) a radical polymerization initiator of the formula:

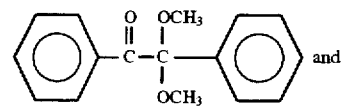

Acridine orange and (ii) a cationic polymerization initiator of the formula:

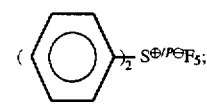

wherein (D) is (i) a radical polymerization initiator of the formula: 1,3,3,1',3',3'-hexamethyl-2,2'-indodicarbocyanine tri-p-methoxyphenylbutylborate and

and (ii) a cationic polymerization initiator of the formula:

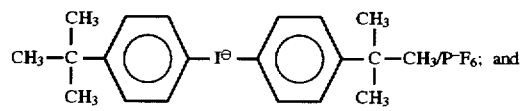

wherein E is (i) a radical polymerization initiator of the formula:

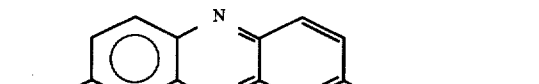

and

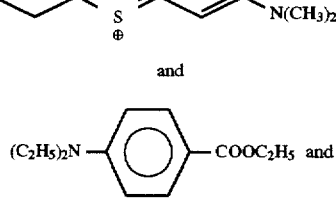

(ii) a cationic polymerization initiator of the formula:

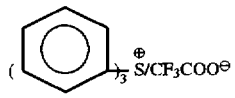

wherein said irradiation provides a difference in refractive index between an irradiated portion and a non-irradiated portion of the recording layer.

2. The volume phase hologram according to claim 1, wherein the composition further contains a binder.

3. The volume phase hologram according to claim 1, wherein the composition contains the radical-polymerizable monomer in an amount of from 10 to 60% by weight.

4. The volume phase hologram according to claim 1, wherein the composition contains the cationic-polymerizable monomer in an amount of from 10 to 60% by weight.

5. The volume phase hologram according to claim 1, wherein the composition is applied on a substrate to form a coating film.

6. A volume phase hologram produced by the process comprising irradiating a recording layer of a volume phase hologram recording medium with coherent radiation employing an object beam and a reference beam from opposite sides, said volume phase hologram recording medium comprising a substrate of a glass plate or a transparent film and a recording layer on said substrate, said recording layer comprising a composition containing (a) a radical-polymerizable monomer, (b) a cationic-polymerizable monomer, and (c) an initiator combination of a radical-polymerization initiator having a sensitivity in a visible light region and a cationic-polymerization initiator having a sensitivity in an ultraviolet light region as main constituents, wherein the radical-polymerization initiator and the cationic-polymerization initiator are sensitive in light wavelength regions different from each other; said radical polymerization initiator being sensitive to coherent radiation in the visible light region of a wavelength of at least about 450 nm to initiate polymerization of said radical-polymerizable monomer to form an interference pattern and said cationic-polymerization initiator being insensitive to said coherent radiation, wherein said irradiation provides a difference in refractive index between an irradiated portion and a non-irradiated portion of the recording layer.

7. The volume phase hologram according to claim 6, wherein the composition further contains a binder.

8. The volume phase hologram according to claim 6, wherein the composition contains the radical polymerization monomer in an amount from 10 to 60% by weight.

9. The volume phase hologram according to claim 6, wherein the composition contains the cationic-polymerizable monomer in an amount from 10 to 60% by weight.

10. The volume phase hologram according to claim 6, wherein the composition is applied on a substrate to form a coating film.

* * * * *

UNITED STATES PATENT AND TRADEMARK OFFICE
CERTIFICATE OF CORRECTION

PATENT NO. : 5,776,634
DATED : July 7, 1998
INVENTOR(S) : NORIO OHKUMA ET AL.

Page 1 of 3

It is certified that error appears in the above-identified patent and that said Letters Patent is hereby corrected as shown below:

COLUMN 2

Line 26, "of the" should be deleted.

COLUMN 3

Line 38, "are-also" should read --are also--.

COLUMN 4

Line 14, ";" should be deleted;
Line 16, "(n=1-3)" should read --(n=1-3);--;
Line 19, "phentyl" should read --phenyl--;
Line 28, "where" should read --(where--;
Line 61, "Cl))" should read --Cl)--;

COLUMN 6

Line 45, "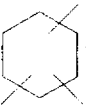" should read ----.

COLUMN 10

Line 29, "them" should read --them with--.

UNITED STATES PATENT AND TRADEMARK OFFICE
CERTIFICATE OF CORRECTION

PATENT NO. : 5,776,634

DATED : July 7, 1998

INVENTOR(S) : NORIO OHKUMA ET AL.

It is certified that error appears in the above-identified patent and that said Letters Patent is hereby corrected as shown below:

COLUMN 11

Line 15, "which" should be deleted.

COLUMN 12

Line 5, "upm" should read --um--.

COLUMN 13

Line 14, "45 t %" should read --45 wt %--.

COLUMN 14

Line 4, "6 wt %" should read --5 wt %--;
Line 42, "$H_4O$" should read --$H_4$-O--;
Line 65, "thereby obtained" should read --to thereby obtain--.

COLUMN 16

Line 57, "a substrate" (second occurrence) should be deleted.

UNITED STATES PATENT AND TRADEMARK OFFICE
CERTIFICATE OF CORRECTION

PATENT NO.  : 5,776,634
DATED       : July 7, 1998
INVENTOR(S) : NORIO OHKUMA ET AL.

It is certified that error appears in the above-identified patent and that said Letters Patent is hereby corrected as shown below:

<u>COLUMN 18</u>

Line 9, "orange" should read --Orange--.

Title page abstract,

Line 10, "of the" should be deleted.

Signed and Sealed this

Fourth Day of May, 1999

Attest:

Q. TODD DICKINSON

*Attesting Officer*      Acting Commissioner of Patents and Trademarks